(12) United States Patent  
Huang et al.

(10) Patent No.: US 6,903,421 B1
(45) Date of Patent: Jun. 7, 2005

(54) ISOLATED HIGH-VOLTAGE LDMOS TRANSISTOR HAVING A SPLIT WELL STRUCTURE

(75) Inventors: Chih-Feng Huang, Jhubei (TW); Ta-yung Yang, Milpitas, CA (US); Jenn-yu G. Lin, Taipei (TW); Tuo-Hsin Chien, Tucheng (TW)

(73) Assignee: System General Corp., Taipei Hsien (TW)

( * ) Notice: Subject to any disclaimer, the term of this patent is extended or adjusted under 35 U.S.C. 154(b) by 0 days.

(21) Appl. No.: 10/758,919

(22) Filed: Jan. 16, 2004

(51) Int. Cl.[7] ............................................. H01L 23/62
(52) U.S. Cl. ..................................... 257/356; 257/335
(58) Field of Search ................................. 257/335, 356

(56) References Cited

U.S. PATENT DOCUMENTS

| | | |
|---|---|---|
| 4,811,075 A | 3/1989 | Eklund et al. .............. 257/369 |
| 5,258,636 A | 11/1993 | Rumennik et al. .......... 257/339 |
| 5,313,082 A | 5/1994 | Eklund et al. .............. 257/262 |
| 6,525,390 B2 | 2/2003 | Tada et al. .................. 257/489 |
| 6,570,219 B1 | 5/2003 | Rumennik et al. .......... 257/343 |
| 6,617,652 B2 | 9/2003 | Noda et al. ................. 257/367 |

*Primary Examiner*—Long Pham
(74) *Attorney, Agent, or Firm*—J.C. Patents

(57) ABSTRACT

The isolated high-voltage LDMOS transistor according to the present invention includes a split N-well and P-well in the extended drain region. The P-well is split in the extended drain region of the N-well to form a split junction-field in the N-well. The split N-well and P-well deplete the drift region, which shifts the electric field maximum into the bulk of the N-well. This achieves a higher breakdown voltage and allows the N-well to have a higher doping density. Furthermore, the LDMOS transistor according to the present invention includes a N-well embedded beneath the source diffusion region. This creates a low-impedance path for the source region, which restricts the transistor current flow between the drain region and the source region.

8 Claims, 4 Drawing Sheets

ISOLATED HIGH-VOLTAGE LDMOS TRANSISTOR HAVING A SPLIT WELL STRUCTURE

BACKGROUND OF THE INVENTION

1. Field of the Invention

The present invention relates to semiconductor devices, and more particularly to a lateral power MOSFET.

2. Description of Prior Art

The development of single chip processes for integrating power switches with control circuitry is a major trend in the field of power IC development. The LDMOS (lateral double diffusion MOS) process in particular is currently being applied to manufacture monolithic ICs. The LDMOS process involves performing planar diffusion on the surface of a semiconductor substrate to form a main current path oriented in the lateral direction. Since the lateral MOSFET is manufactured using a typical IC process, the control circuit and the lateral power MOSFET can be integrated onto a monolithic power IC. An LDMOS process using a reduced surface electric field (RESURF) technique with a low thickness EPI or N-well can achieve a high voltage with low on-resistance.

Recently, many LDMOS designs have been proposed for integrating control circuitry with power switches. Among these, high-voltage LDMOS transistors are described in the following prior arts: "High Voltage MOS Transistors" by Klas H. Eklund, U.S. Pat. No. 4,811,075; "Narrow Radius Tips for High Voltage Semiconductor Devices with Inter-digitated Source and Drain Electrodes" by Vladimir Rumennik and Robert W. Busse, U.S. Pat. No. 5,258,636; and "High Breakdown Voltage Semiconductor Device" by Masaaki Noda, U.S. Pat. No. 6,617,652 B2.

High-voltage and low-resistance LDMOS are disclosed in the following patents: "High Voltage MOS Transistor with a Low On-Resistance" by Klas H. Eklind, U.S. Pat. No. 5,313,082; "MIS Semiconductor Device with Low On Resistance and High Breakdown Voltage" by Gen Tada, Akio Kitamura, Masaru Saito, and Naoto Fujishima, U.S. Pat. No. 6,525,390 B2; and "High-voltage Transistor with Multi-layer Conductor Region" by Vladimir Rumennik, Donald R. Disney, and Janardhanan S. Ajit, U.S. Pat. No. 6,570,219 B2.

One drawback of all of these prior arts is that the electric field maximum of the transistor occurs near the silicon surface. This may cause reliability problems during high-temperature operation. Another drawback of these prior-art transistors is non-isolated source structure. With monolithic designs, non-isolated transistor current could flow around the substrate and generate noise interference in the control circuit.

To overcome these drawbacks, the present invention proposes a split well structure for spreading the electric field into the body of the transistor. This can substantially improve the reliability of the transistor. Additionally, an isolated transistor structure is proposed to control a transistor current flow.

SUMMARY OF THE INVENTION

The isolated high-voltage LDMOS transistor according to the present invention is manufactured on top of a P-substrate. A first diffusion region and a second diffusion region having N conductivity-type form an N-well disposed in the P-substrate. The first diffusion region also acts as an extended drain region. A drain diffusion region having N+ conductivity-type forms a drain region disposed in the extended drain region. A third diffusion region having P conductivity-type forms a P-well separately located in the extended drain region.

A source diffusion region having N+ conductivity-type forms a source region. A contact diffusion region having P+ conductivity-type forms a contact region. A fourth diffusion region having P conductivity-type forms an isolated P-well for preventing breakdown. The isolated P-well is located in the second diffusion region in order to enclose the source region and the contact region. A conduction channel is formed through the N-well. The conduction channel connects the source region with the drain region. A polysilicon gate electrode is embedded above the conduction channel to control a transistor current flow.

The P-well is placed in the extended drain region of the N-well to form a split junction-field in the N-well. The split N-well and P-well deplete the drift region, which shifts the electric field maximum into the area of the N-well. Furthermore, the N-well generated by the second diffusion region produces a low-impedance path for the source region, which restricts the transistor current flow between the drain region and the source region.

It is to be understood that both the foregoing general descriptions and the following detailed descriptions are exemplary, and are intended to provide further explanation of the invention as claimed. Still further objects and advantages will become apparent from a consideration of the ensuing description and drawings.

BRIEF DESCRIPTION OF THE DRAWINGS

The accompanying drawings are included to provide a further understanding of the invention, and are incorporated in and constitute a part of this specification. The following drawings illustrate embodiments of the invention and, together with the description, serve to explain the principles of the invention.

DESCRIPTION OF THE PREFERRED EMBODIMENTS

Figure 1:
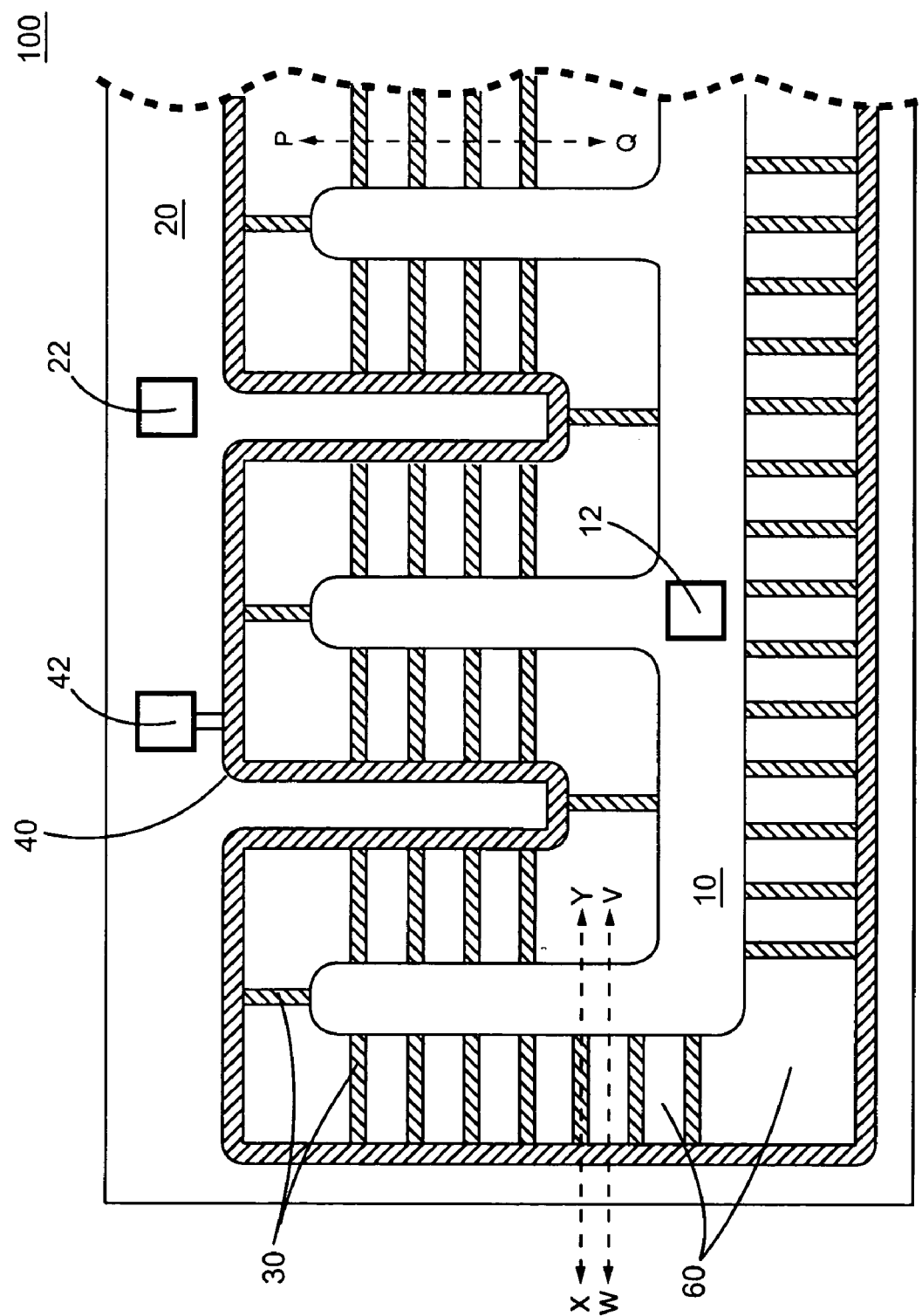
FIG. 1 shows a top view of a high-voltage LDMOS transistor according to a preferred embodiment of the present invention.

FIG. 1 is a top view of a LDMOS transistor 100 according to a preferred embodiment of the present invention. The LDMOS transistor 100 according to the present invention consists of a split N-well 30 and a P-well 60.

The LDMOS transistor 100 further includes a drain electrode 10, a source electrode 20, a polysilicon gate electrode 40, a bonding pad 12 for the drain electrode 10, a bonding pad 22 for the source electrode 20, and a bonding pad 42 for the polysilicon gate electrode 40. The P-well 60 splits the N-well 30. The N-well 30 is established from the drain electrode 10 to the source electrode 20.

Figure 2:
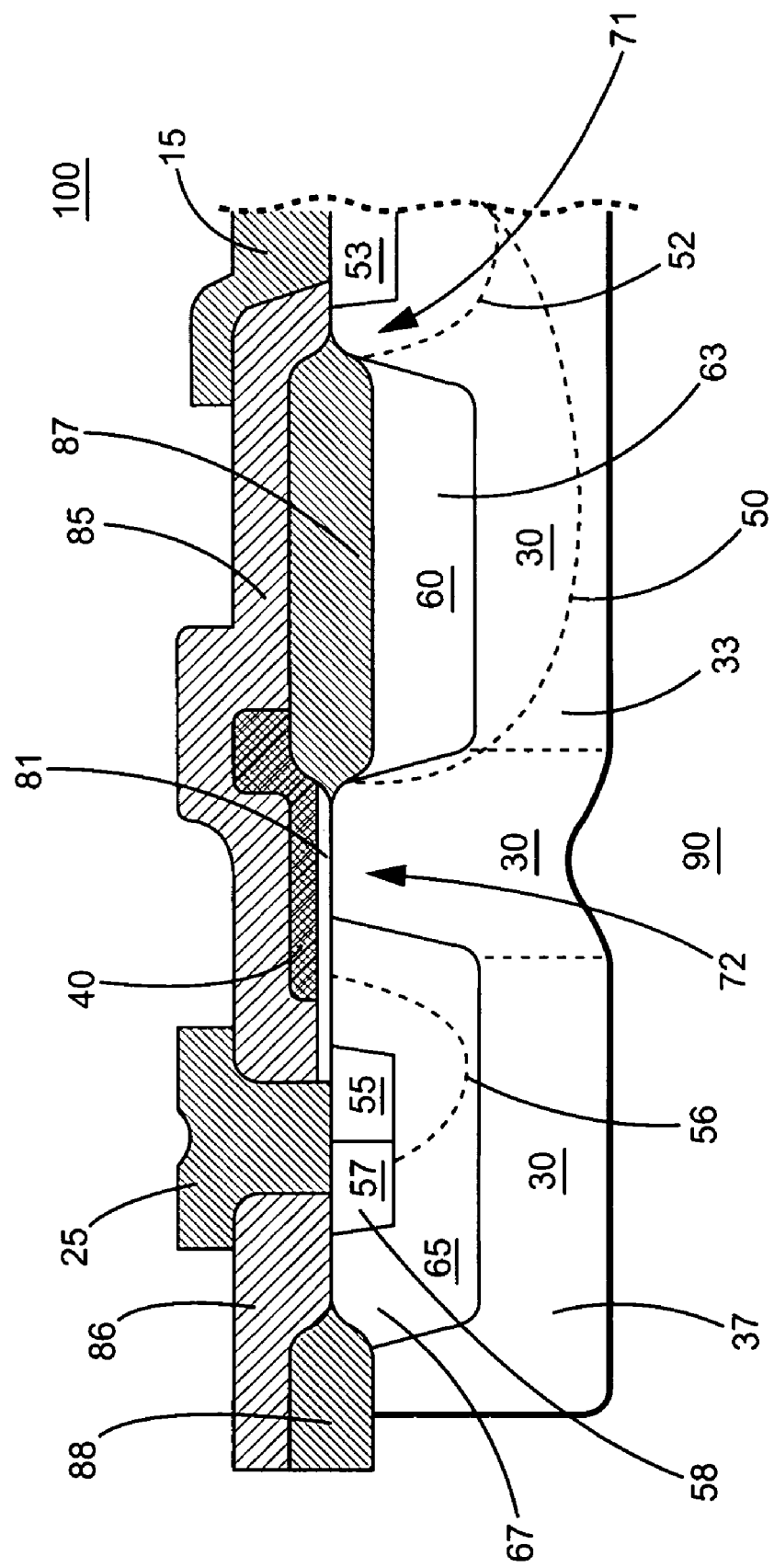
FIG. 2 is a first cross-sectional view of the high-voltage LDMOS transistor showing a split P-well according to a preferred embodiment of the present invention.
Figure 3:
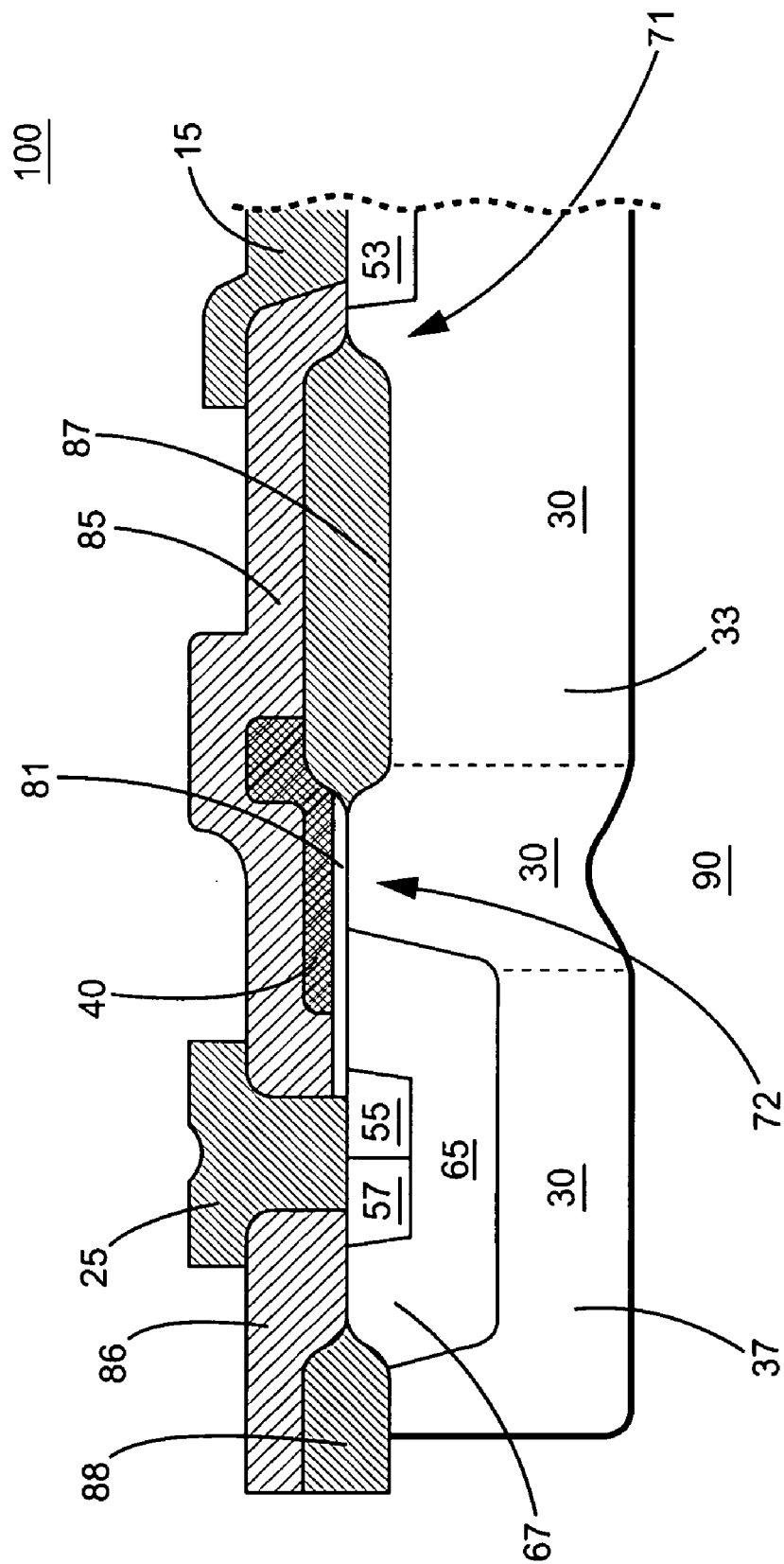
FIG. 3 is a second cross-sectional view of the high-voltage LDMOS transistor showing a split N-well according to a preferred embodiment of the present invention.

FIG. 2 is a first cross-sectional view of the LDMOS transistor 100 according to a preferred embodiment of the present invention. The LDMOS transistor 100 is shown between the source electrode 20 and the drain electrode 10. The first cross-sectional structure runs along the dotted line W-V in FIG. 1. FIG. 3 is a second cross-sectional view. The second cross-sectional structure runs along the dotted line X-Y in FIG. 1.

The LDMOS transistor 100 is formed on top of a P-substrate 90. The N-well 30 is formed by embedding a first diffusion region 33 having N conductivity-type and a second diffusion region 37 having N conductivity-type in the P-substrate 90. The first diffusion region 33 also acts as an extended drain region 50 in the area of the first diffusion region 33. A drain diffusion region 53 having N+ conductivity-type forms a drain region 52 in the extended drain region 50.

The P-well 60 is formed by a third diffusion region 63 having P conductivity-type. The third diffusion region 63 is separately located in the extended drain region 50.

A source diffusion region 55 having N+ conductivity-type form a source region 56. A contact diffusion region 57 having P+ conductivity-type forms a contact region 58. A fourth diffusion region 67 having P conductivity-type forms an isolated P-well 65 for preventing breakdown. The isolated P-well 65 is located in the second diffusion region 37 in order to enclose the source region 56 and the contact region 58.

A conduction channel is formed through the N-well 30. The conduction channel connects the source region 56 and the drain region 52. A thin gate oxide 81 and a thick field oxide 87 are formed on the P-substrate 90. A polysilicon gate electrode 40 is formed above portions of the gate oxide 81 and the field oxide 87 to control a transistor current flow through the conduction channel. A drain-gap 71 maintains a space between the drain diffusion region 53 and the field oxide 87. A source-gap 72 maintains a space between the field oxide 87 and the isolated P-well 65. Proper placement of the drain-gap 71 and the source-gap 72 can substantially increase the breakdown voltage of the LDMOS transistor 100.

A silicon dioxide insulation layer 85 and a silicon dioxide insulation layer 86 cover the polysilicon gate electrode 40, the field oxide 87, and a field oxide 88. A drain metal contact 15 acts as a metal electrode for contacting the drain diffusion region 53. A source metal contact 25 acts as a metal electrode for contacting the source diffusion region 55 and the contact diffusion region 57.

Referring back to FIG. 1 and FIG. 2, the extended drain region 50 and the drain diffusion region 53 combine to form the drain electrode 10. The isolated P-well 65, the source diffusion region 55, and the contact diffusion region 57 combine to form the source electrode 20. The bonding pad 12 is connected to the drain metal contact 15. The bonding pad 22 is connected to the source metal contact 25. The bonding pad 42 is connected to the polysilicon gate electrode 40.

Figure 4:
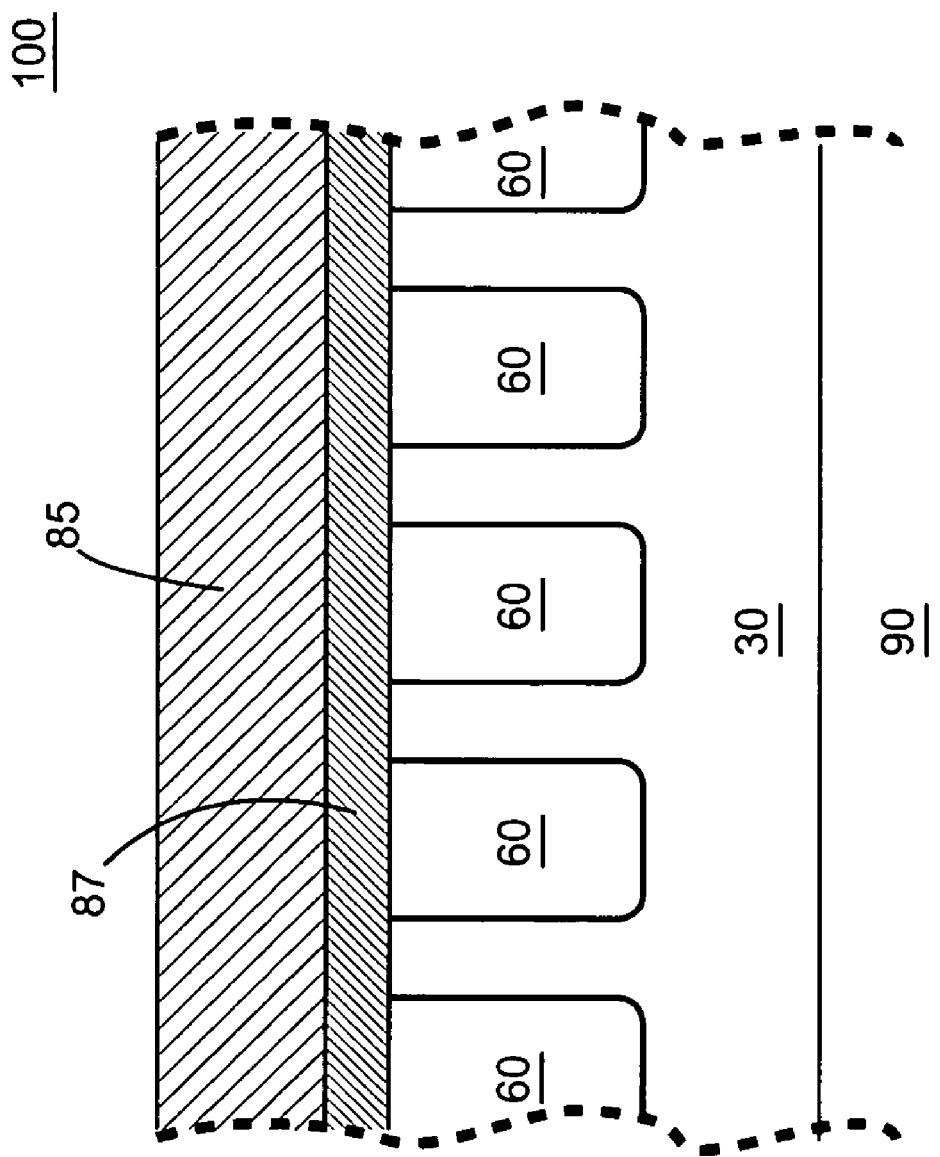
FIG. 4 is a third cross-sectional view of the high-voltage LDMOS transistor showing the split N-well and P-well according to a preferred embodiment of the present invention.

FIG. 4 is a third cross-sectional view of the LDMOS transistor 100. The third cross-sectional structure runs along the dotted line P-Q in FIG. 1. The P-well 60 is placed in the extended drain region 50, so as to form a split junction-field in the N-well 30. The split N-well 30 and the P-well 60 deplete a drift region, which shifts the electric field maximum into the area of the N-well 30. When the drift region is fully depleted, the conduction channel is substantially less prone to breakdown. To achieve a high breakdown voltage for the LDMOS transistor 100, the extended drain region 50 must be fully depleted before breakdown occurs. The split N-well 30 and the P-well 60 enable the extended drain region 50 to be depleted before breakdown occurs even though the doping density of the drift region is high. Additionally, each split junction-field can further disperse the electric field.

The depleted region of the LDMOS transistor 100 is increased beyond the area of the conduction channel. The area of the depleted region extends from substantially above the vertical junction of the N-well 30 and the P-well 60 to substantially below the boundary of the N-well 30 and the P-substrate 90. This allows the drift region to have high doping density and low resistance. To enable the LDMOS transistor 100 to simultaneously have a low resistance and a high breakdown voltage, the width and the doping density of the split N-well 30 and the P-well 60 must be properly selected.

Furthermore, the N-well 30 generated by the second diffusion region 37 produces a low-impedance path for the source region 56, which restricts the transistor current flow between the drain region 52 and the source region 56.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An isolated high-voltage LDMOS transistor comprising:
    a P-substrate;
    a first diffusion region and a second diffusion region having N conductivity-type, wherein said first diffusion region and said second diffusion region form a N-well in said P-substrate, wherein said first diffusion region forms an extended drain region;
    a drain diffusion region, for forming a drain region, said drain diffusion region having N+ conductivity-type, wherein said drain region is disposed in said extended drain region;
    a third diffusion region, for forming a P-well separately located in said extended drain region of said N-well, said third diffusion region having P conductivity-type;
    a source diffusion region, for forming a source region, said source diffusion region having N+ conductivity-type, wherein a conduction channel is formed through said N-well, wherein said conduction channel connects said source region and said drain region;
    a contact diffusion region, for forming a contact region, said contact diffusion region having P+ conductivity-type; and
    a fourth diffusion region, for forming an isolated P-well to prevent breakdown, said fourth diffusion region having P conductivity-type, wherein said isolated P-well is located in said second diffusion region in order to enclose said source region and said contact region, wherein said N-well created by said second diffusion region produces a low-impedance path for said source region, wherein said N-well generated by said second diffusion region restricts a transistor current flow between said drain region and said source region.

2. The isolated high-voltage LDMOS transistor of claim 1, wherein said extended drain region and said drain diffusion region form a drain electrode.

3. The isolated high-voltage LDMOS transistor of claim 1, wherein said isolated P-well, said source diffusion region, and said contact diffusion region form a source electrode.

4. The isolated high-voltage LDMOS transistor of claim 1, wherein said N-well is established from said drain electrode to said source electrode.

5. The isolated high-voltage LDMOS transistor of claim 1, wherein said P-well splits said N-well.

6. The isolated high-voltage LDMOS transistor of claim 1 further comprising:
- a thin gate oxide and a thick field oxide formed on said P-substrate;
- a polysilicon gate electrode, for controlling said transistor current flow in said conduction channel, wherein said polysilicon gate electrode is placed above portions of said thin gate oxide and said thick field oxide;
- a drain-gap, for maintaining a space between said drain diffusion region and said thick field oxide;
- a source-gap, for maintaining a space between said thick field oxide and said isolated P-well, wherein the placement of said drain-gap and said source-gap substantially increases the breakdown voltage of said isolated high-voltage LDMOS transistor;
- a silicon dioxide insulation layer, covering said polysilicon gate electrode and said thick field oxide;
- a drain metal contact, having a metal electrode for contacting with said drain diffusion region; and
- a source metal contact, having a metal electrode for contacting with said source diffusion region and said contact diffusion region.

7. The isolated high-voltage LDMOS transistor of claim 1 further comprising:
- a drain bonding pad, for said drain electrode, wherein said drain bonding pad is connected to said drain metal contact;
- a source bonding pad, for said source electrode, wherein said source bonding pad is connected to said source metal contact; and
- a gate bonding pad, connected to said polysilicon gate electrode.

8. The isolated high-voltage LDMOS transistor of claim 1, wherein said P-well splits said extended drain region of said N-well to form a split junction-field in said N-well, wherein said split N-well and said P-well deplete a drift region.

* * * * *